United States Patent [19]

Dagostino et al.

[11] 4,271,486

[45] Jun. 2, 1981

[54] WAVEFORM STORAGE SYSTEM

[75] Inventors: Thomas P. Dagostino, Portland; Luis J. Navarro, Beaverton, both of Oreg.

[73] Assignee: Tektronix, Inc., Beaverton, Oreg.

[21] Appl. No.: 61,720

[22] Filed: Jul. 30, 1979

[51] Int. Cl.³ .............................................. G11C 13/00
[52] U.S. Cl. ....................................... 365/45; 365/46; 307/238.4
[58] Field of Search ........................... 365/100, 45, 46; 307/238

[56] References Cited

U.S. PATENT DOCUMENTS 3,812,478 5/1974 Tomisawi .............................. 365/100

Primary Examiner—Terrell W. Fears
Attorney, Agent, or Firm—George T. Noe

[57] ABSTRACT

A waveform storage system is provided in which waveform envelopes or maximum signal deviations along a waveform are detected and stored. A sampling clock operates at a predetermined fixed rate independently of a recording clock which is operable at rates determined by the sweep speed and is equal to or slower than the sampling clock. Data from an analog-to-digital converter is simultaneously applied to at least one latch and at least one comparator to be compared with the latch output. If the absolute value of the signal is greater than that stored in the latch, the latch is updated with the new value. The contents of the latch are clocked into memory by the recording clock.

10 Claims, 3 Drawing Figures

WAVEFORM STORAGE SYSTEM

BACKGROUND OF THE INVENTION

This invention relates generally to the storage of a waveform by a digital oscilloscope, and in particular to a digital system for detecting and storing waveform envelopes or maximum signal deviations along a waveform.

Conventional digital oscilloscopes record amplitude vs. time waveforms by acquiring amplitude samples at equally-spaced time points along the time axis of the waveform and converting the samples to digital data for storage and subsequent display. The waveform memory typically is capable of storing one complete screen width, or frame, of information. Because memory space is finite, only a limited number of samples may be acquired, irrespective of sampling rate, conversion speed, or time base sweep rate. For example, for a 1-K memory and four bits of data per sample, only 256 samples are required to fill the memory. In terms of time intervals between samples, this means that for a sweep rate of one millisecond per division (10 divisions per frame), 40 microseconds elapse from the time one sample is acquired until the next sample is acquired. Even with more sophisticated and expensive systems having 4-K memories and eight bits of resolution, only 512 samples may be acquired per frame. The utility of one frame of information thus recorded is somewhat restricted, and may be misleading or even erroneous because phenomena occuring between samples is not recorded.

Often it is desired to record high frequency signals over a long time frame, or to record the envelope of a waveform, or to detect narrow transients which may occur on an otherwise low-frequency waveform such as a 1 microsecond spike over a 10 second frame requiring 10 million words (2500 times larger than available memory space). Previously, this information could only be observed on an analog oscilloscope or stored on a bistable storage cathode-ray tube.

SUMMARY OF THE INVENTION

In accordance with the present invention, a waveform storage system is provided in which waveform envelopes or maximum signal deviations along a waveform are detected and stored. A conventional waveform memory of finite memory space such as a 1-K or a 4-K memory having 256 or 512 addresses is provided. A recording clock is provided to clock waveform data into these addresses at equally-spaced intervals along the time-base axis of the waveform, and the recording clock operates at different speeds depending upon the timebase sweep rate to provide the same number of samples for each frame. A sampling clock is provided to operate an analog-to-digital converter (ADC) at a fixed rate which is equal to or higher than the fastest rate of the recording clock. The acquired data is continuously compared with previously acquired data during the interval between recording clock pulses, and the maximum and minimum amplitudes thereby obtained are kept while all the other samples are discarded. Upon arrival of the recording clock pulse, the maximum and minimum signal values obtained over the interval are clocked into memory, and a new interval cycle begins. Therefore, at the end of the acquisition of one complete frame, the memory contains the maximum and minimum signal values obtained during each recording clock interval along the waveform.

An envelope of repetitive waveforms may be recorded by comparing the maximum and minimum signals acquired during each interval with those acquiring during a previous frame and already stored in memory, and then storing the new maximum and minimum values.

It is, therefore, one object of the present invention to provide a waveform storage system for detecting and storing maximum signal deviations along a waveform.

It is another object to provide a waveform storage system for detecting and storing the envelope of a waveform.

It is a further object to provide a waveform storage system in which a data acquisition system may operate at its highest conversion rate irrespective of the recording clock rate or available memory space.

It is an additional object to provide a waveform storage system in which long time frames may be acquired digitally without loss of amplitude resolution due to slow sampling rates.

It is yet another object to provide a waveform storage system in which aliasing of input data is easily detected.

It is yet a further object to provide a waveform storage system for recording slow changes such as caused by amplifier drift.

Other objects and advantages of the present invention will become apparent to those having ordinary skill in the art when taken in conjunction with the accompanying drawings.

DETAILED DESCRIPTION OF THE INVENTION

Figure 1:
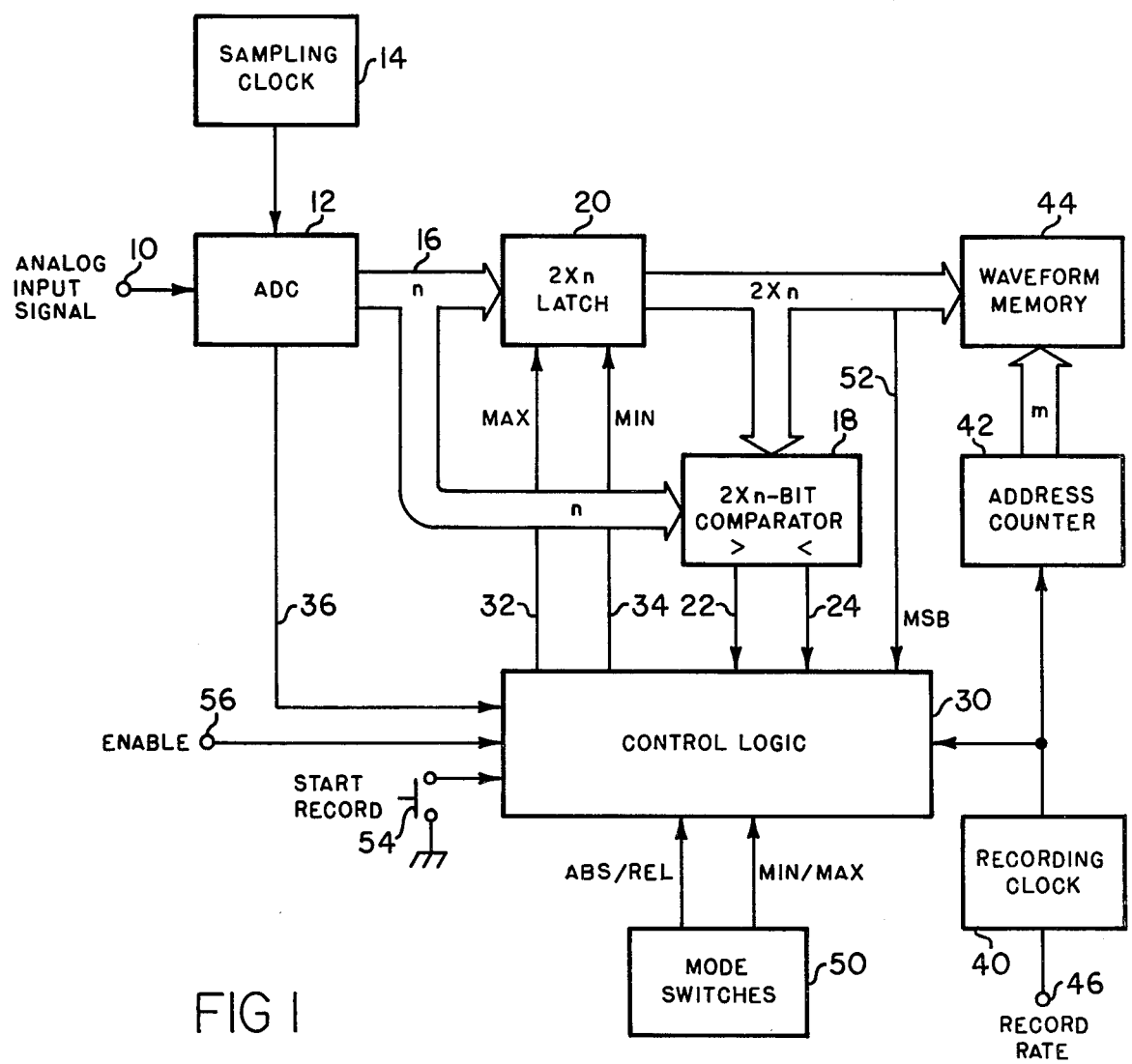
FIG. 1 is a block diagram of a waveform storage system in accordance with the present invention.

Referring to the block diagram of FIG. 1, an analog signal is applied via an input terminal 10 to an ADC 12. Here instantaneous values of the analog signal are converted to digital data at a rate determined by a sampling clock 14, and the n bits of digital data are output on a set of data lines 16. This digital data simultaneously is compared by a comparator 18 with two sets of previously acquired data stored in a latch 20. The two sets of data stored in latch 20 are respectively maximum and minimum signal values. If the new data is greater than the previously-stored maximum, or less than the previously-stored minimum, the comparator 18 puts a signal on line 22 or line 24 respectively to notify a control logic circuit 30 that a new value has been detected. The control logic circuit 30 in turn places a strobe signal on either line 32 or 34 to strobe the new maximum or minimum signal value into latch 20. This cycle repeats in synchronism with the sampling clock 14, and the latch 20 is updated whenever a new maximum or minimum value is detected. A derivative of the sampling clock signal is applied via line 36 to the control logic circuit 30 to notify the control logic circuit 30 that analog-to-digital conversion has been completed.

A recording clock 40 produces clock pulses to drive an address counter 42, which in turn selects addresses of a memory 44 to store the maximum and minimum amplitude values stored in latch 20. The recording clock pulses are also applied to the control logic circuit 30 to reset the latch 20 and initiate a new timing interval. The waveform memory 44 has a finite number of addressable storage locations, for example, 256, 512, or 1024, to store both the maximum and minimum waveform values for one complete frame. The recording clock 40 is scaled to the time-base sweep rate to provide the appropriate number of clock pulses over a complete frame to select each address of the memory 44. Therefore, the recording clock 40 may be operable at several clock rates to provide the correct number of pulses for each sweep rate. Scaling information from the associated time-base circuit is applied via terminal 46 to establish the record rate of the recording clock 40. Such a recording clock 40 may typically include a crystal-controlled clock to generate a precise reference clock signal, and appropriate countdown circuits to provide the correct scaling of the record clock output.

The control logic circuit coordinates the operation of comparator 18 and latch 20 in detecting the maximum and minimum values of the input waveform. In addition to the clock signals discussed hereinabove, control logic circuit 30 is conditioned by several other inputs. Front-panel mode switches 50 permit selection of several different operating modes, including either relative or absolute maximum or minimum, or both maximum and minimum in the relative positive-negative sense. Absolute in this case refers to the larger or smaller absolute value, irrespective of polarity. In this regard, the most significant bit of either latch 20 output may be applied to the control logic circuit 30 over a line 52 to indicate the polarity. A push button switch 54 to ground resets the control logic, latch, and comparator circuits to permit a new waveform to be recorded. An enable-disable signal may be applied via terminal 56 to control logic circuit 30. For example, it may be desirable to utilize the sweep gate signal from the associated timebase circuit as an enable signal. Also, if the digital oscilloscope has a normal operating mode, it would be desirable to disable the maximum and minimum detection circuitry during normal operation.

Figure 2:
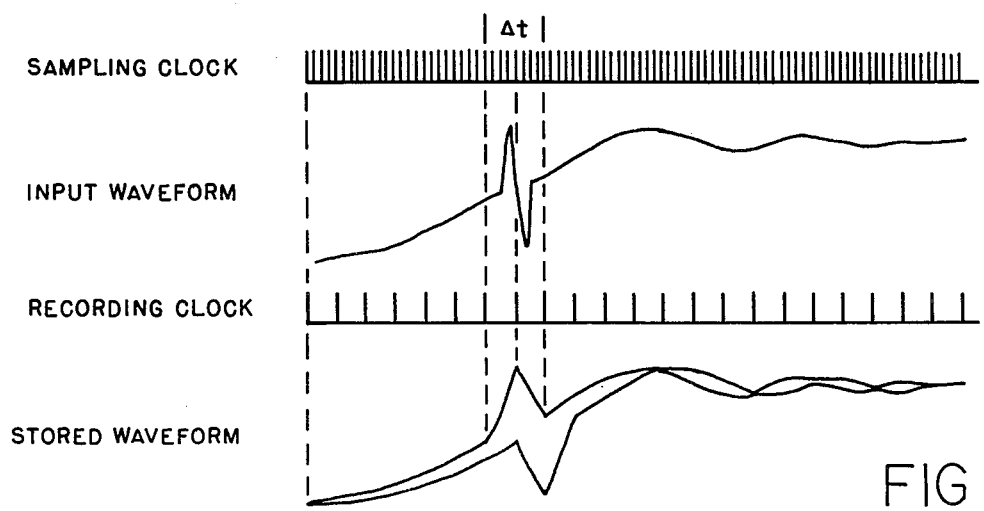
FIG. 2 shows the relationship between sampled and recorded waveforms.

FIG. 2 depicts the timing relationship between the sampling clock and the recording clock, as well as the relationship between the input waveform and the recorded waveform. The sample clock 14 may suitably operate at a fixed rate of five megahertz, producing a sample clock pulse every 200 nanoseconds. The recording clock 40 may suitably provide a range of appropriately scaled clock rates from 2.5 megahertz to 10 Hertz (400 nanoseconds to 100 milliseconds). For this example, assume that the sweep rate is set to one millisecond per graticule division (sweep length of 10 milliseconds), and that the recording clock pulses are occuring every 20 microseconds so that 512 data points comprising one frame may be stored. Under these conditions, 100 sampling clock pulses occur for each recording clock pulse, and, therefore, aberrations which are present in the waveform can more easily be detected. Consider the interval $\Delta t$, during which a high-speed transient, or glitch, occurs. For ordinary waveform sampling, this glitch would go completely undetected; however, for the present system, the maximum and minimum amplitudes are detected over the two recording clock pulse intervals of $\Delta t$ and are stored on the recording clock edge. From a comparison of the input and stored waveforms in FIG. 2, it can be seen that the maximum and minimum amplitudes for each recording clock interval are detected and stored. It will be appreciated that because the sampling clock rate is fixed, resolution increases as the sweep rate is decreased because a larger number of samples can be evaluated over a recording clock interval.

Figure 3:
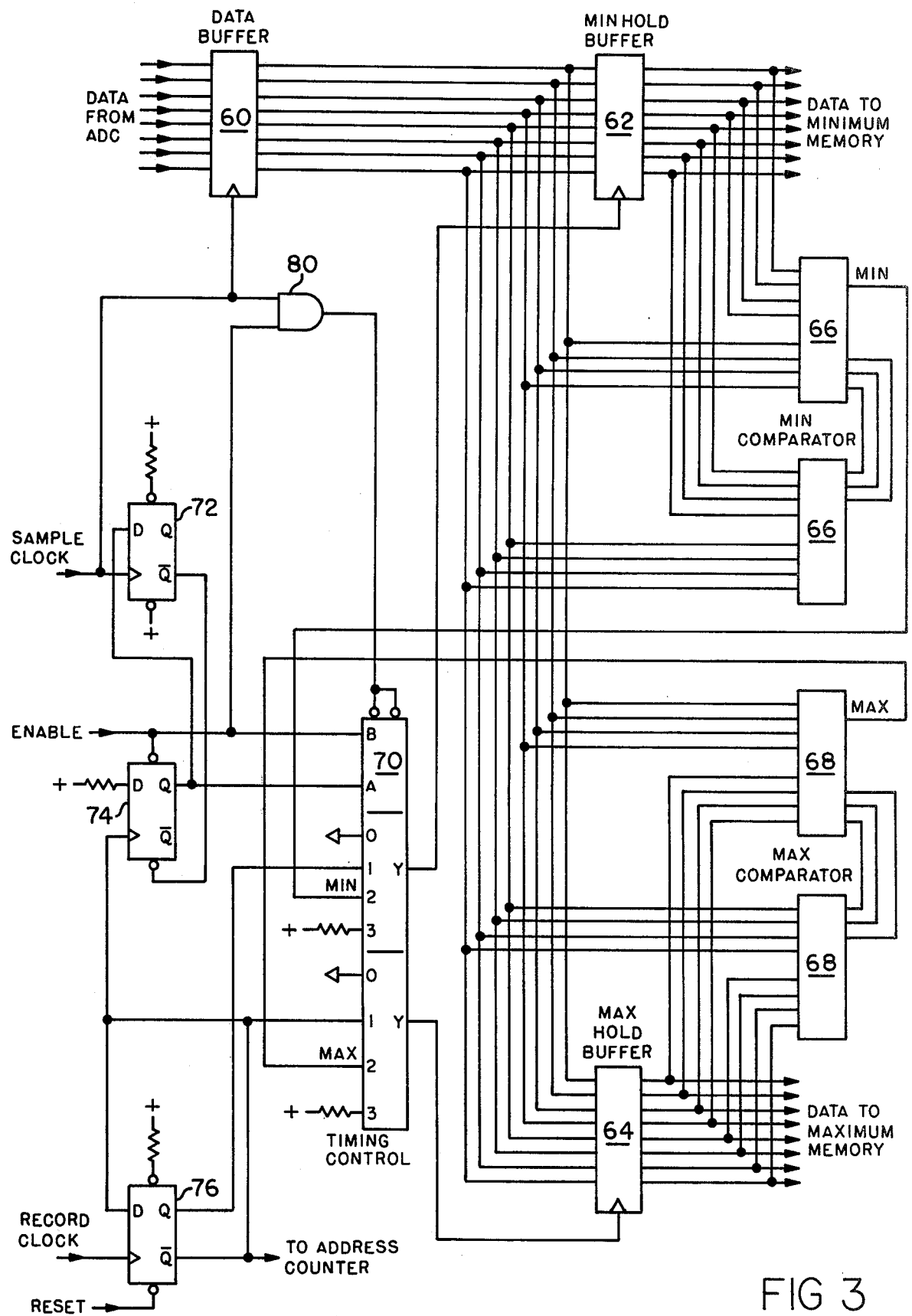
FIG. 3 is a detailed schematic of one embodiment in accordance with the present invention.

FIG. 3 is a detailed schematic of one embodiment for detecting waveform maximum and minimum amplitude values in accordance with the present invention. The circuit utilizes TTL logic devices such as 74-series integrated circuits. A quantized signal in the form of 8 bits of parallel data is applied from an analog-to-digital converter to a data buffer 60. Substantially coincident with the arrival of data, a sampling clock edge is applied to the data buffer 60 to latch the data. The data output of buffer 60 is made available to a minimum-hold buffer 62, a maximum-hold buffer 64, a minimum comparator 66, and a maximum comparator 68. The three buffers 60, 62, and 64 may suitably be 74S374 integrated circuit latches. The comparators 66 and 68 may each comprise a pair of 74LS85 4-bit magnitude comparators connected to provide an 8-bit comparator.

The control logic circuit comprises a timing control circuit 70, three clocked D-type flip-flops 71, 74, and 76, and an AND gate 80. The timing control circuit suitably may be a 74S153 dual 4-line-to-1-line data selector/multiplexer. Inputs to the control logic circuit include the sample clock, the record clock, enable and reset signals, and minimum (min) and maximum (max) pulses. Outputs from the control logic circuit include the sample clock to the data strobe input of data buffer 60 and the timing strobes from the Y outputs of the timing control circuit 70 to the data strobe inputs of the min and max hold buffer 62 and respectively. Flip-flop 76 provides a 2:1 countdown of the record clock signal. Flip-flops 72 and 74 are interconnected to form a state machine to control the A enable line of timing control circuit 70.

Operation of the overall circuit of FIG. 3 in the envelope detection mode is as follows: To start a waveform acquisition cycle, the Enable line is set high and the Reset line is pulled low, causing the $\overline{Q}$ output of flip-flop 76 to go high, triggering flip-flop 74 and causing its Q output to go high. The result of this action is that the A and B enable inputs of timing control circuit 70 are both high, conditioning the circuit so that a negative clock edge from AND gate 80 strobes the logical highs at both data inputs 3 to the Y outputs, strobing the min and max hold buffers 62 and 64 respectively to initialize the buffers with latched data from data buffer 60.

On the next sample clock positive edge, several things occur. The output of AND gate 80 goes high, terminating the strobe signal, causing both Y outputs of circuit 70 to go low. New data from the ADC is latched into data buffer 60. The $\overline{Q}$ output of flip-flop 72 goes low, resetting flip-flop 74 and causing its Q output, and hence the A enable line of timing control circuit 70, to go low. Of course, it is assumed that the B enable line of circuit 70 remains high for the entire acquisition cycle. The new data in data buffer 60 is compared with the initial data values stored in buffers 62 and 64. If the new data is less than the stored value, comparator 66 places a logical high on its output line to be applied to the data input 2 of the min section of timing control circuit 70. If the new data is greater than the stored value, comparator 68 places a logical high on its output line to be applied to the data input 2 of the max section of timing control circuit 70. On the sample clock's low half cycle, timing control circuit 70 is strobed by the output of AND gate 80, passing whichever logical high is on either data input 2 to its corresponding Y output, strobing the appropriate min or max hold buffer and latching the new data therein. This process repeats on each cycle of the sampling clock over the recording clock interval. In this particular circuit, the record clock is counted down by a factor of two, so that the next record clock signal after reset serves only to return flip-flop 76 to its initialized state with the $\overline{Q}$ output high and the Q output low.

Upon receipt of the second record clock positive edge, the minimum and maximum waveform values detected during the two-record-clock-pulse interval are stored in memory. The $\overline{Q}$ output of flip-flop 76 goes high, and this signal is applied to an address counter which selects the appropriate addresses of associated minimum and maximum memories. The logical high at the $\overline{Q}$ output of flip-flop 76 also fires the state machine flip-flop 74, placing a logical high at the A enable input of timing control circuit 70 so that upon the next negative-going half cycle of the sampling clock signal applied via AND gate 80, both the min and max hold buffers 62 and 64 will be strobed simultaneously and will thereby be re-initialized to begin a new envelope detection interval over two record clock cycles.

The data acquisition continues as the foregoing cycles are repeated until the memories are filled. At this point, the Enable signal is removed from input B of timing control circuit 70, precluding any further operation thereof since the acquisition cycle is complete.

Besides the envelope detection mode just described, the circuit of FIG. 3 may be operated in a conventional normal digital oscilloscope mode as well. In this mode, timing control circuit 70 operates as a multiplexer to alternately strobe the hold buffers 62 and 64 in response to record clock signals applied via flip-flop 76 to both data inputs 1 thereof.

While the invention has been described in its preferred embodiment, it is to be understood that the words which have been used are words of description rather than limitation and that changes within the purview of the appended claims by those having ordinary skill in the art may be made without departing from the true scope and spirit of the invention in its broader aspects.

What we claim as being novel is:

1. A waveform storage system, comprising:
   a waveform memory;
   means for converting an analog signal to successive digital data representative of instantaneous signal values at a predetermined first rate;
   means for receiving said successive digital data from said conversion means and detecting therefrom digital data representative of maximum signal deviation values occuring over an interval determined by a second rate; and
   means for storing said detected digital data in said waveform memory at said second rate,
   wherein said first rate is greater than or equal to said second rate.

2. A waveform storage system in accordance with claim 1 wherein said waveform memory comprises a plurality of addressable storage locations, said conversion means comprises a sample clock and an analog-to-digital converter, and said storing means comprises a record clock and an address counter.

3. A waveform storage system in accordance with claim 1 wherein said detecting means includes latch means for temporarily storing data representative of maximum signal deviation values, comparison means for comparing the contents of said latch means with said successive digital data from said conversion means to determine new maximum signal deviation values, and means for updating said latch means with data representative of said new maximum signal deviation values.

4. A waveform storage system in accordance with claim 3 wherein said latch means includes a first latch for storing data representative of maximum signal amplitudes and a second latch for storing data representative of minimum signal amplitudes, and said comparison means includes first and second comparators coupled to said first and second latches respectively and to said conversion means.

5. A waveform storage system in accordance with claim 3 wherein said means for updating said latch means comprises logic control means responsive to said comparison means for generating control signals for said latch means.

6. A waveform storage system in accordance with claim 5 wherein said logic control means includes a timing control circuit to synchronize generation of said control signals with said conversion means and said storing means.

7. A waveform storage system, comprising:
   a sampling clock for producing first clock pulses at a predetermined first rate;
   an analog-to-digital converter for converting an analog signal to successive digital data at said first rate;
   a waveform memory;
   a recording clock for producing second clock pulses at a second rate which is equal to or slower than said first rate;
   means for detecting maximum and minimum signal values which occur during each recording clock interval; and
   means responsive to said second clock pulses for transferring said detected maximum and minimum signal values to said waveform memory.

8. A waveform storage system in accordance with claim 7 wherein said maximum and minimum signal value detecting means includes latch means for holding said maximum and minimum values, comparison means for determining new maximum and minimum values, and logic control means for updating said latch means with said new values.

9. A waveform storage system in accordance with claim 8 wherein said latch means comprises first and second latches, said comparison means comprises first and second comparators coupled to said first and second latches respectively and to said analog-to-digital converter to generate respectively maximum and minimum signal value detection signals, and said logic control control means includes a timing control and data selection circuit responsive to said detection signals and said sampling clock signals to generate latch-update control signals.

10. A waveform storage system in accordance with claim 9 wherein said logic control means is further responsive to said recording clock pulses to initialize both of said first and second latches at the beginning of said each recording clock interval.

* * * * *